United States Patent

Burzio et al.

[11] Patent Number: 6,166,587
[45] Date of Patent: Dec. 26, 2000

[54] CMOS CIRCUIT FOR GENERATING A CURRENT REFERENCE, THE CIRCUIT COMPRISING A TRANSISTOR IN A WEAK INVERSION REGION

[75] Inventors: Marco Burzio, Grugliasco; Emanuele Balistreri, Battipaglia, both of Italy

[73] Assignee: CSELT-Centro Studi E Laboratori Telecomunicazioni S.p.A., Turin, Italy

[21] Appl. No.: 09/409,033

[22] Filed: Sep. 29, 1999

[30] Foreign Application Priority Data

Oct. 5, 1998 [IT] Italy ................................ TO98A0831

[51] Int. Cl.[7] .................................................. G05F 1/10
[52] U.S. Cl. ............................................ 327/538; 323/316
[58] Field of Search .................................. 327/513, 530, 327/538, 543; 323/312, 315, 316

[56] References Cited

U.S. PATENT DOCUMENTS 5,939,933  8/1999  Wang ........................................ 327/530
6,031,414  2/2000  Kitamura ................................. 327/538

OTHER PUBLICATIONS

"CMOS Analog Circuit Design" Phillip E.Allen et al, Holt, Rinehart and Winston the Deyden Press, Saunders College Publ. 14 pages.

"CMOS Current Reference Without Resistance", Henri J.Oguey, IEEE Journal of solid–state circuits. vol.32, No. 7,Jul. 1997, 4 pages.

*Primary Examiner*—Jung Ho Kim
*Attorney, Agent, or Firm*—Herbert Dubno

[57] ABSTRACT

A current reference generator comprises a pair of identical units (G1, G2) which generate respective current references (I1, I2), and a circuit (CL) for the linear combination of the two references. In each of the two units, the elements (S1, S2) which, by their current-voltage characteristics, determine the working point comprise respectively a single transistor (T1) and a pair of transistors (T2, T3), of the same type as the first, connected in series. A differential amplifier (AD) maintains stable the working point of the respective unit as power supply voltage varies. (FIG. 2)

8 Claims, 8 Drawing Sheets

CMOS CIRCUIT FOR GENERATING A CURRENT REFERENCE, THE CIRCUIT COMPRISING A TRANSISTOR IN A WEAK INVERSION REGION

The present invention relates to CMOS analogue integrated circuits, and more specifically it concerns a circuit for generating a current reference to be used within one such integrated circuit.

Current reference generators are a basic element of analogue integrated circuits, where they are used as stable bias current source for oscillators, amplifiers, phase lock loop (PLL) circuits, etc.

A current reference generator must be as independent as possible from the fabrication process (so that different specimens of the generator exhibit behaviours that are as similar as possible), as well as from technological variations (so that it is possible to adapt to technological advances) and from the working conditions of the individual circuit (in particular from power supply voltage and from temperature). A further requirement, typical for CMOS generators, is that the circuit should not make use of particular elements, such as diffuse resistors or bipolar junction transistors, which give rise to needless complications in the lay-out of the integrated circuit. The use of elements such as bipolar junction transistors would, furthermore, make the circuit extremely sensitive to technological variations.

Current reference generators are based on the principle of matching the voltage drop across a pair of mutually connected elements having such current-voltage characteristics as to present a stable intersection point (equilibrium point); a feedback circuit detects deviations from the equilibrium point and tends to bring the working point of the generator back thereto.

A first example of CMOS current reference generator is described in the book "CMOS Analog Circuit Design", by P. E. Allen and D. R. Holberg, published by Holt, Rinehart and Winston, New York, USA, 1987 (see Chapter 5.5, pp. 240–251). This generator uses a current mirror circuit to generate two substantially equal currents that are made to pass respectively in a first transistor and in an integrated resistor. An additional transistor serves as a feedback element. The unit also comprises a start-up circuit which prevents the circuit from reaching a second equilibrium point represented by the point (0,0) of the current-voltage characteristic. This generator has the advantage of manufacturing simplicity, but it only achieves independence from power supply voltage and is very sensitive to fluctuations in the technological process and to temperature variations.

A proposal has already been put forth (see the paper "CMOS Current Reference Without Resistance" by Henri J. Oguey and Daniel Aebischer, IEEE Journal of Solid-State Circuits, vol. 32, no. 7, July 1997, pp. 1132–1135) to replace the integrated resistor by a second transistor of the same type as the first: a lesser sensitivity to temperature is thereby obtained (±10%), but there is still a very strong sensitivity to process and power supply voltage fluctuations, causing the overall fluctuations in the generated current to be quite large (roughly ±30%, according to the paper). Moreover, the circuit has very large size (linear size of a few hundreds of microns).

According to the invention a circuit is instead provided that presents a high independence from the technological process as well as from power supply voltage variations and from temperature variations.

The circuit according to the invention comprises at least a first unit for generating a current reference, comprising:

a first and a second element having respective current-voltage characteristics with such a behaviour as to present an intersection point whereto a first current reference corresponds, both elements being made by active components and the first element comprising a first transistor at the output whereof the reference is present, means for injecting a same current into said two elements, a start-up circuit, to bring the unit to operate in correspondence with a working point represented by the intersection point of the current-voltage characteristics of said two elements, and a feedback circuit to maintain the working point of the circuit in correspondence with said intersection point as operating conditions vary, and is characterised in that said first transistor is a low gain transistor;

said second element comprises a second and a third transistor connected in series, which have the same type of doping as the first transistor and present much higher gain than the first transistor;

the injection means are arranged to inject such a current as to bring the first transistor to operate in conditions of strong saturation and the second and third transistors to operate in conditions of weak inversion, and the feedback circuit comprises a differential amplifier that receives at its inputs the voltage present across said first and second element and provides said injection means with a control signal such as to maintain the circuit in said working point.

According to another important characteristic of the invention, the circuit further comprises a second unit for generating a current reference, having the same structure as the first and comprising a first and second element with respective current-voltage characteristics such that the intersection point corresponds with a current value that differs from that of the characteristics of the first and second elements of the first unit, and said two units are connected to means for the linear combination of the respective currents.

For the sake of greater clarity, reference is made to the accompanying drawings, wherein.

Figure 1:
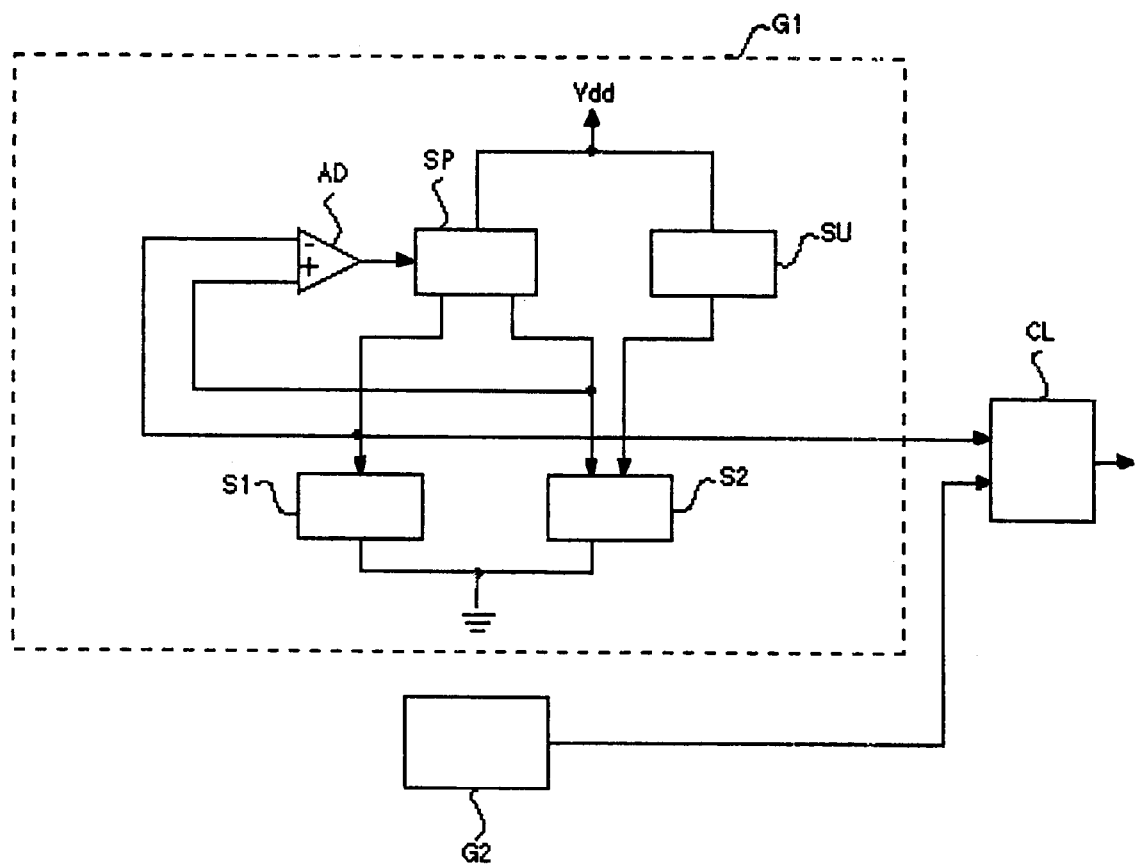
FIG. 1 is a block diagram of the circuit of the invention.

With reference to FIG. 1, the circuit for generating a current reference according to the invention essentially comprises a pair of units G1, G2 (having identical circuit diagrams but destined to generate different references which are both substantially independent from fluctuations in the fabrication process and from fluctuations in the power supply voltage) and a circuit CL arranged to effect a linear combination of the outputs of the two units G1, G2 to achieve independence from temperature, as will be described farther on.

As indicated in detail for the unit G1, each of the two units comprises: a pair of detectors S1, S2 (the term "detectors" shall hereafter be used to indicate the elements that determine the working point of the circuit, represented by the intersection point of the respective current-voltage characteristics) connected to a current mirror SP destined to inject a same current into the two detectors S1, S2; a differential amplifier AD, which constitutes the feedback circuit and is destined to generate a current signal to be provided to the mirror SP to maintain the units in the equilibrium point as the operating conditions (in particular, power supply voltage) vary; and a start-up circuit SU that injects into the detector S2, as long as the voltage across the detector itself is lower than a certain minimum value, such a current as to prevent the circuit from moving to the second equilibrium point represented by a nil value of current and voltage.

Figure 2:
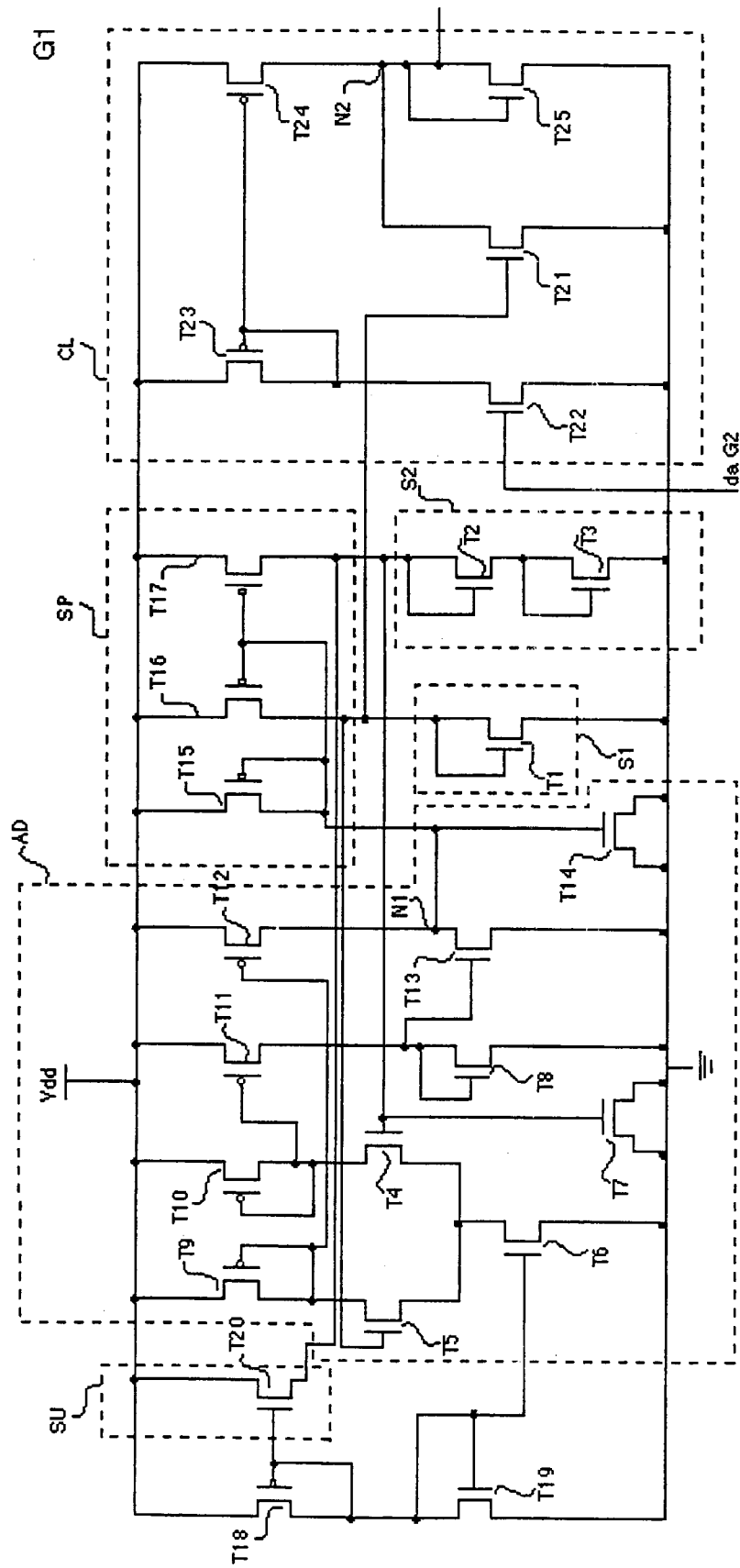
FIG. 2 is a partial circuit diagram.
Figure 3:
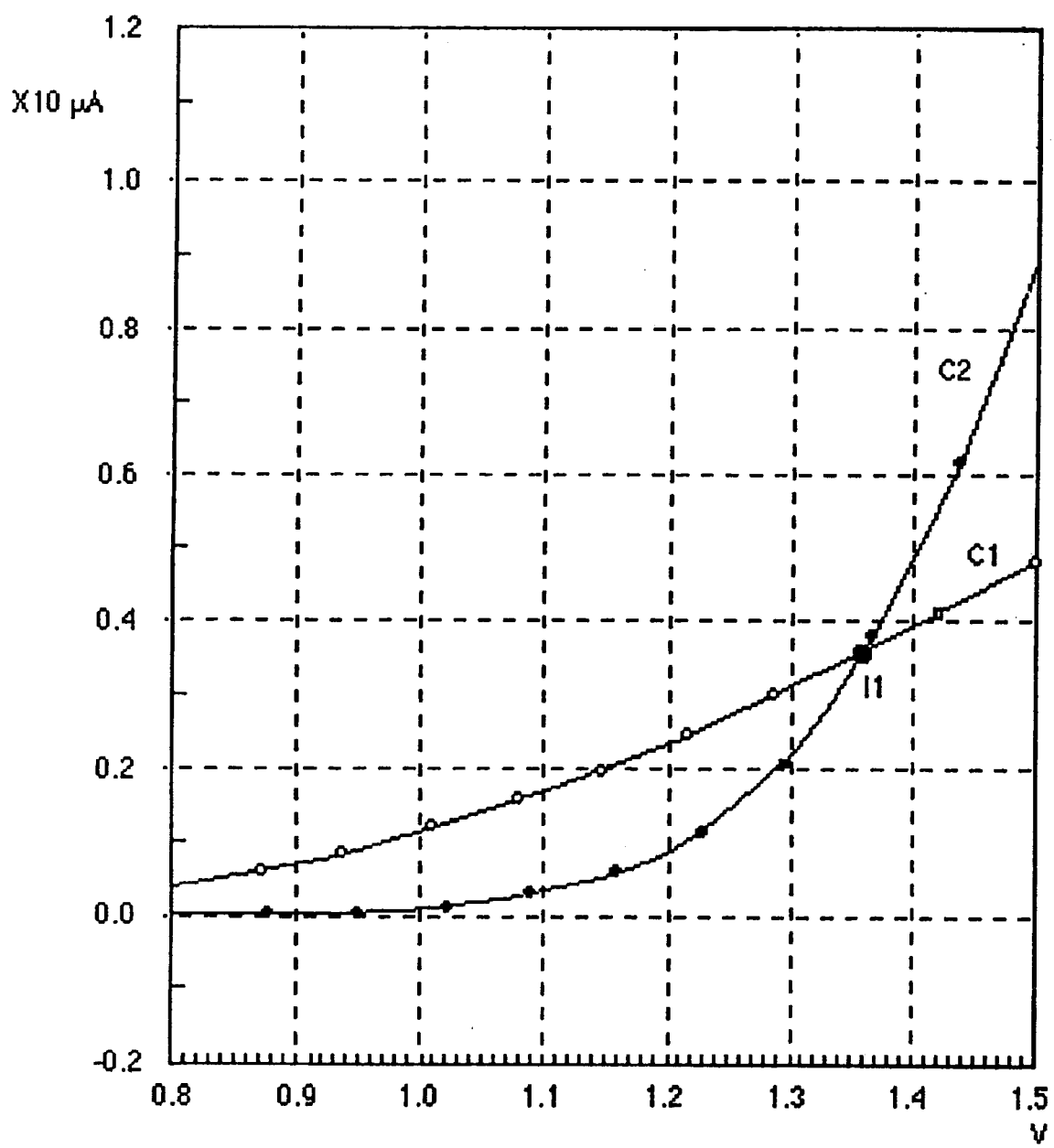
FIGS. 3 to 7 are graphs of the characteristics of the components that illustrate the operation of the invention, under different process and working conditions.
Figure 4:
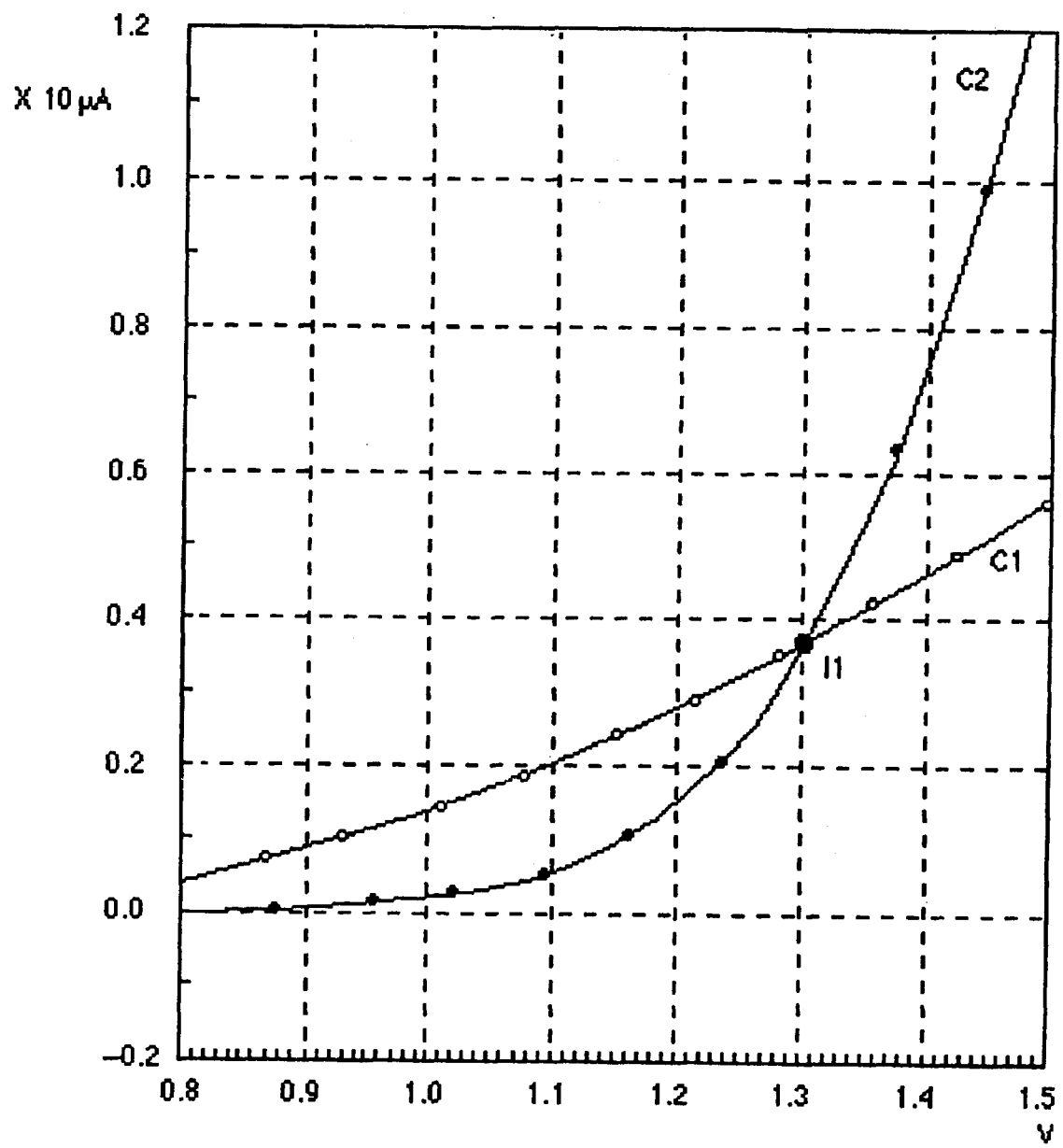

As better shown in the circuit diagram of FIG. 2, the detector S1 is constituted by a single transistor T1 (in particular of the N type), as in the prior art, whereas the second detector S2 is constituted by a pair of transistors T2, T3, of the same type as T1, mutually connected in series. It is essential for the transconductance (or gain) characteristics of transistor T1 to be very different from those of the transistors T2, T3, so that an equilibrium point of the circuit differing from the point (0,0) of the current-voltage characteristics exists and is actually attainable. In particular, the transistor T1 has very low transconductance, whereas transistors T2, T3 have very high transconductance. A possible qualitative behaviour of the characteristics of the two detectors is shown in FIGS. 3, 4, where C1, C2 are the characteristics of detectors S1 and S2, respectively. Due to the series arrangement of the transistors, it is evident that the pair of transistors T2, T3 has a threshold that is substantially double that of the transistor T1 and, given the different slope of the characteristics, an equilibrium point actually does exist and is represented by the intersection point of the curves C1, C2. As is well known to the person skilled in the art, in the manufacture as an integrated circuit, different characteristics can be obtained by means of a different width/length ratio of the transistors. Preferably, the width/length ratio of the transistor T1 is the reciprocal of that of the transistors T2, T3, and the gain of the transistor T1 is the inverse of that of T2 and T3. The reference I1 indicates the current corresponding to the equilibrium point.

The transistor T1 and the pair of transistors T2, T3 are made very close together in the integrated circuit. Being the transistors of the same type, this guarantees a good independence from the characteristics of the technological process, for it is intuitively obvious that any fluctuation in the results of the technological process will influence the two detectors to the same extent. Analysis of the performance of circuits realised at different times has demonstrated that the effect of the fluctuations is in practice a parallel shift of the characteristics of the detectors, such as to leave substantially unchanged the current I1 relating to the equilibrium point, as it can be appreciated from a comparison between the FIGS. 3, 4, which respectively refer to a process that gives rise to a "slow" circuit and to a process that gives rise to a "fast" circuit. Similarly, an advance in the technological manufacturing processes will have a similar influence on the two detectors.

The differential amplifier AD is constituted by the set of transistors from T4 to T14 (where the transistors T4 to T8, T13, T14 are of the N type and the others of the P type), as is clear to the person skilled in the art. The transistors in AD are chosen so as to provide such a gain as to stabilise the working point with high precision, e.g. in the order of one millivolt. The voltage present across the two detectors S1 and S2 is applied to the gate of the transistors T4, T5. The current signal representative of the difference is taken at the node N1, to which the drain electrodes of the transistors T12 and T13 are connected, and is provided to the current mirror SP constituted by the transistors T15, T16, T17, of the P type. The transistor T14, also included in AD, only serves for stabilisation purposes.

The transistor T20 constitutes the start-up circuit SU, whereas the transistors T19, T18 are biasing transistors of the circuit SU and of the differential amplifier AD.

Figure 5:
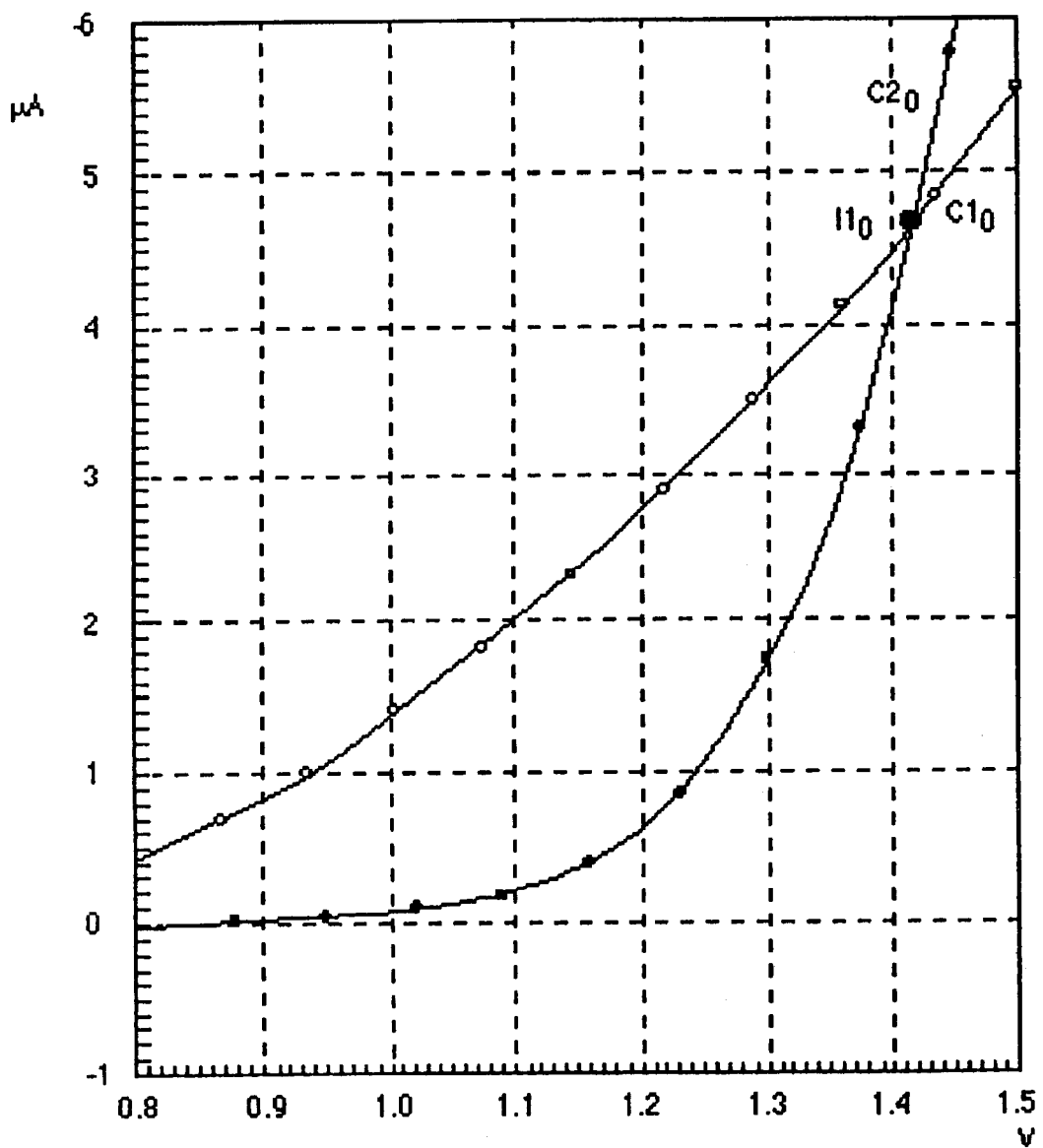
Figure 6:
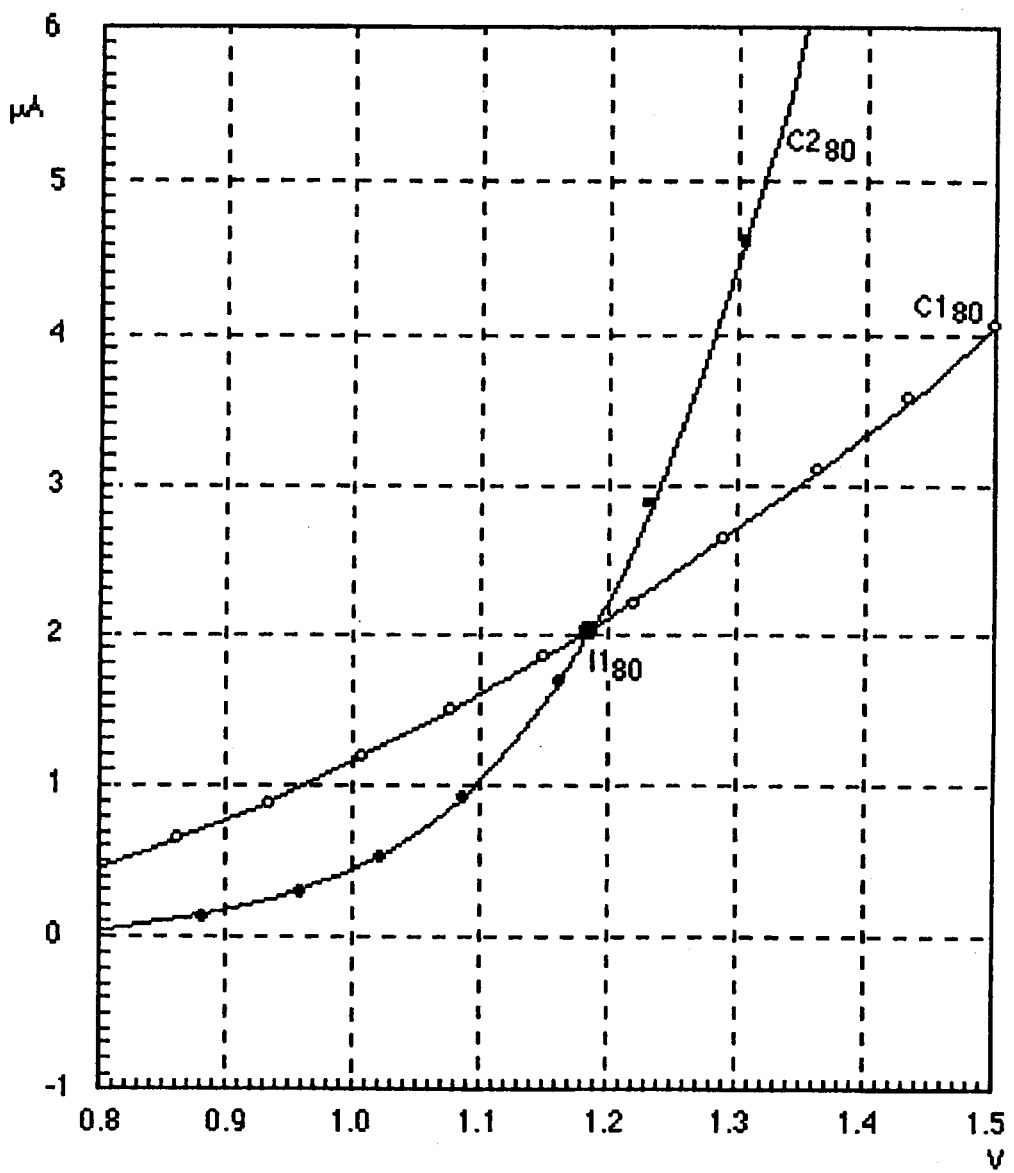

A generator like G1 guarantees a good insensitivity to the variations of the process of manufacturing the integrated circuit and of the power supply, as stated above, but it is not arranged to assure good independence from temperature. Given the structure of the two detectors, the transistor T1 will generally work in conditions of high saturation whereas the two transistors T2, T3, connected in series, work in a weak inversion zone. Consequently, the behaviour of the two detectors as temperature varies is different. In particular, the current-voltage characteristic of the detector S1 tends to become less steep as temperature grows, thus tending to lower the intersection point and hence the reference current, whereas the characteristic of the detector S2 presents a leftward shift that accentuates the lowering of the working point. This clearly results from a comparison between FIGS. 5 and 6, which show the behaviour of the characteristics of the transistors of the detectors S1, S2 at low temperature (e.g. 0°, curves $C1_0$, $C2_0$) and at high temperature (e.g. 80°, curves $C1_{80}$, $C2_{80}$), respectively, and the respective equilibrium points $I1_0$, $I1_{80}$.

Figure 7:
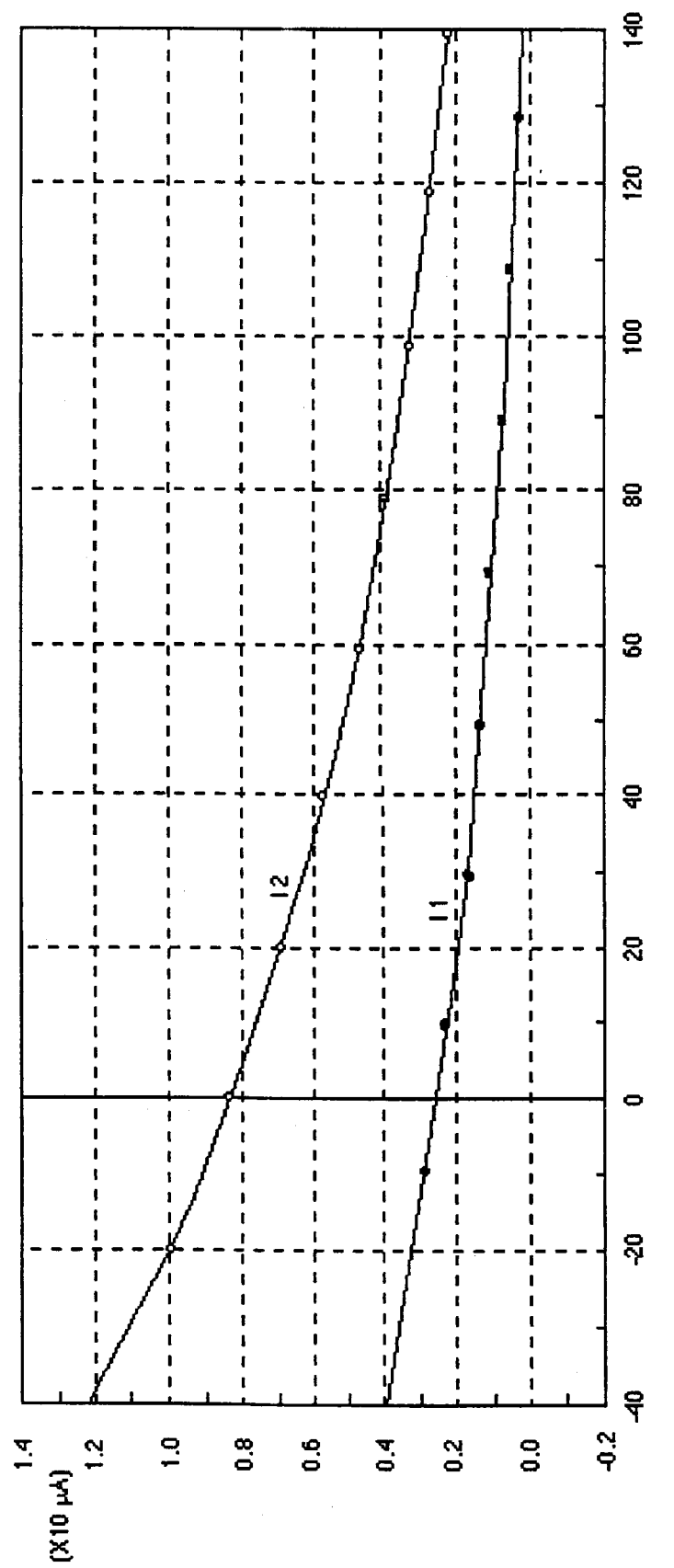

As stated above, the linear combination of the current references generated by both units G1, G2 (FIG. 1) is the characteristic of the invention that allows to achieve independence from temperature. For this purpose the second unit G2 (which is made according to the same circuit diagram as G1 and hence has not been shown in detail), must employ detectors whose transistors have different values of the respective gains from those of the homologous transistors of G1 and such that the current I2 is different from I1 both in terms of value and in terms of behaviour as temperature varies. In a preferred embodiment of the invention, the transistors T1, T2 (or T3) of the generator G1 had a gain ratio of 1:400, whereas the corresponding transistors of the generator G2 had a gain ratio of 1:100; moreover, the decrease in I2 as temperature increases was greater than that of I1, as shown in FIG. 7. Under these conditions, the circuit CL can effect a linear combination of the two currents in such a way that, indicating for instance by I1', I2' the currents generated by the two units G1, G2 at the upper end of the envisioned temperature range, by I1", I2" the currents generated by the two units G1, G2 at the lower end of the range, and by I1, I2 the currents generated at a generic temperature value T in the range under consideration, the current Ir supplied by the circuit meets the condition $$Ir = K1 \cdot I1' - K2 \cdot I2' = K1 \cdot I1'' - K2 \cdot I2'' = K1 \cdot I1 - K2 \cdot I2 = K$$

where K is a constant.

If the behaviour of the temperature in the range is considered linear, by setting $I1'' = \alpha I1'$ and $I2'' = \beta I2'$ (with $\alpha, \beta > 1$) one immediately sees that the above condition is met by the values $$K1 = \frac{\beta - 1}{\beta - \alpha} \quad \text{and} \quad K2 = \frac{\alpha - 1}{\beta - \alpha}.$$

Actually, the value of Ir determined with these coefficients will be approximately constant, but not exactly constant, since the behaviour of the current of the transistors with the temperature is linear only as a first approximation and only within a certain temperature range (typically 20°–80°), as FIG. 7 shows.

Figure 8:
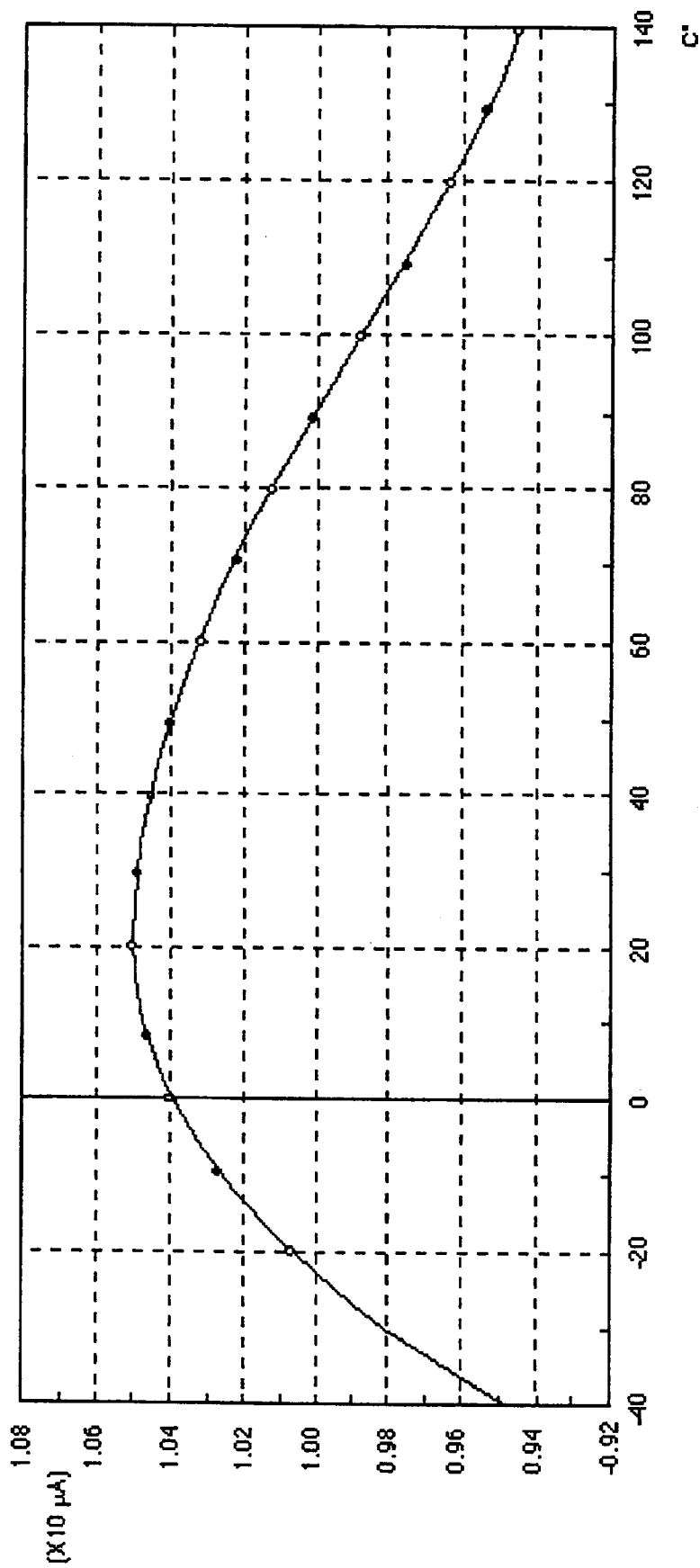
FIG. 8 is a graph of the performance of the invention.

Tests carried out have demonstrated that the generator according to the invention offers a good independence from temperature within a range between −40° C. and +135° C.: the results of the tests, for K1=6.5 and K2=17.3 are shown in FIG. 8, where one can see that the fluctuations due to temperature are in the order of ±5%. The same tests have shown that, under the worst conditions, process variations and voltage variations can contribute for a further ±10% to fluctuations of Ir: the improvement over the prior art is evident.

Reverting to FIG. 2, the linear combination circuit CL is constituted by the transistors T21 . . . T25. The transistors T21, T22 constitute, respectively with the transistor T1 and the homologous transistor in G2, two current mirrors that supply the currents K1·I1, K2·I2. The transistors T23, T24, of the P type, constitute an additional current mirror with unit multiplication ratio which therefore supplies the current K2·I2 anew. The drain electrodes of T21 and T24 are connected together and constitute a subtraction node N2 of the linear combination circuit. Lastly the transistor T25, which has its gate and drain electrodes connected to the node N2, constitutes the first stage of current mirrors that replicate the current generated by the circuit described in order to supply it to individual user devices.

It is evident that the description above is provided solely by way of non limiting example, and that variations and modifications are possible without thereby departing from the scope of the invention. In particular, a complementary circuit diagram can be adopted, by replacing the P transistors with N transistors and vice versa and mutually exchanging the power supplies.

What is claimed is:

1. CMOS circuit for generating a current reference, comprising at least a first unit (G1) destined to generate a first current reference and comprising:

a first and a second element (S1, S2) having respective current-voltage characteristics with such a behaviour as to present an intersection point whereto corresponds said first current reference (I1), both elements being made by active components and the first element (S1) comprising a first transistor (T1) at whose output the first reference (I1) is present, means (SP) for injecting a same current into said two elements (S1, S2), a start up circuit (SU), to bring the unit to operate in correspondence with said intersection point of the current-voltage characteristics of said two elements (S1, S2), and a feedback circuit (AD) to maintain the working point of the circuit in correspondence with said intersection point as the operating conditions vary, characterised in that said first transistor (T1) is a low gain transistor, said second element (S2) comprises a second and a third transistors (T2, T3) connected in series, which have the same type of doping as the first transistor (T1) and present much higher gain than the first transistor (T1);

the injection means (SP) are arranged to inject such a current as to bring the first transistor (T1) to operate in conditions of strong saturation and the second and third transistors (T2, T3) to operate in conditions of weak inversion, and the feedback circuit comprises a differential amplifier (AD) that receives at its inputs the voltage present across said first and second element (S1, S2) and provides said injection means (SP), with a control signal such as to maintain the circuit in said working point.

2. Circuit as claimed in claim 1, characterised in that it further comprises a second unit (G2) for generating a current reference, having the same structure as the first (G1) and comprising a first and second element with such respective current-voltage characteristics that the intersection point corresponds to a current value (I2) that is different from that of the characteristics of the first and second elements of the first unit, and in that said two units are connected to means (CL) for the linear combination of the respective currents.

3. Generator as claimed in claim 2, characterised in that the first and the second unit (G1, G2) are arranged to generate currents that present a different temperature behaviour.

4. Circuit as claimed in claim 1, characterised in that in both units (G1, G2) said first transistor (T1) has a gain that is the inverse of that of the second and of the third transistors (T2, T3).

5. Circuit as claimed in claim 4, characterised in that the ratio between the gains of the first (T1) and of the second or the third transistor (T2, T3) of the first unit (G1) is in the order of 1:400.

6. Circuit as claimed in claim 4, characterised in that the ratio between the gains of the first and of the second or the third transistor of the second unit (G2) is in the order of 1:100.

7. Circuit as claimed in claim 1, characterised in that the second unit (G2) is arranged to generate a current whose variation, within a predetermined temperature range, is greater than the variation of the current of the first unit (G1) within the same range.

8. Circuit according to claim 1, characterised in that the linear combination means (CL) comprise:

a fourth and a fifth transistor (T21, T22), connected respectively to the first transistor (T1) of the first and of the second units (G1, G2) in such a way as to form therewith a first and a second current mirror which multiply the currents (I1, I2) supplied by said first and second units by respective factors, a sixth and a seventh transistor (T23, T24), which form a third current mirror (T23, T24) arranged to invert the sign of the current exiting the second mirror, the seventh transistor (T24) and the fourth transistor (T21) having common electrode which constitutes a subtraction node (N2) for the currents supplied by said first and third mirror, an eight transistor (T25) which has the gate and the drain electrodes connected to said subtraction node (N2) and which constitutes the first stage of additional current mirrors destined to apply the reference generated by the circuit to utilisation devices.

\* \* \* \* \*